US010197419B2

(12) United States Patent
Deak et al.

(10) Patent No.: US 10,197,419 B2
(45) Date of Patent: Feb. 5, 2019

(54) MAGNETIC ABSOLUTE ROTARY ENCODER

(71) Applicant: MultiDimension Technology Co., Ltd., Zhangjiagang (CN)

(72) Inventors: James Geza Deak, Zhangjiagang (CN); Jilie Wei, Zhangjiagang (CN); Jingfeng Liu, Zhangjiagang (CN)

(73) Assignee: MultiDimension Technology Co., Ltd., Zhangjiagang, Jiangsu (CN)

( * ) Notice: Subject to any disclaimer, the term of this patent is extended or adjusted under 35 U.S.C. 154(b) by 22 days.

(21) Appl. No.: 14/765,250

(22) PCT Filed: Jan. 29, 2014

(86) PCT No.: PCT/CN2014/071725
§ 371 (c)(1),
(2) Date: Jul. 31, 2015

(87) PCT Pub. No.: WO2014/117734
PCT Pub. Date: Aug. 7, 2014

(65) Prior Publication Data
US 2015/0369628 A1    Dec. 24, 2015

(30) Foreign Application Priority Data

Feb. 1, 2013    (CN) .......................... 2013 1 0040970

(51) Int. Cl.
*G01B 7/30* (2006.01)
*G01D 5/12* (2006.01)
(Continued)

(52) U.S. Cl.
CPC ................. *G01D 5/12* (2013.01); *G01B 7/30* (2013.01); *G01D 5/145* (2013.01); *G01D 5/147* (2013.01);
(Continued)

(58) Field of Classification Search
CPC ...................................................... G01B 7/30
(Continued)

(56) References Cited

U.S. PATENT DOCUMENTS 3,007,067 A * 10/1961 Snyder .................... G01P 3/487
310/111
5,543,613 A    8/1996 Mettker
(Continued)

FOREIGN PATENT DOCUMENTS

CN    2723965 Y    9/2005
CN    2903916 Y    5/2007
(Continued)

OTHER PUBLICATIONS

Chen, Jian; Partial Translation of CN102628703 A; Aug. 2012.*
(Continued)

*Primary Examiner* — Jermele M Hollington
*Assistant Examiner* — Douglas X Rodriguez
(74) *Attorney, Agent, or Firm* — Schwegman Lundberg & Woessner, P.A.

(57) ABSTRACT

Provided is a magnetic absolute rotary encoder, comprising a rotation shaft, multiple rotating wheels that can rotate along the rotation shaft, multiple encoding units that correspond to the multiple rotating wheels one-to-one, and one or more permanent magnet assemblies that provide the magnetic bias to the multiple encoding units. Each encoding unit comprises a magnetically permeable encoder disc, the structure thereof enabling the magnetic permeability thereof to be different according to the different positions of the rotation shaft, and comprises multiple sensor units that comprise multiple magnetic sensors. The sensor units are used to sense the magnetic permeability of the magnetically permeable encoder disc and to output the sensor signals that characterize the relative position of the magnetically permeable encoder disc. According to the sensor signals of the sensor units, each encoding unit outputs the value that characterizes the selected rotation position of the corresponding rotation wheel, thereby enabling an absolute magnetic rotating encoder that is simple and low in cost and has more precise magnetic encoder discs.

20 Claims, 12 Drawing Sheets

(51) Int. Cl.
*G01D 5/14* (2006.01)
*G01D 5/249* (2006.01)
*G01D 5/251* (2006.01)
*G01F 15/06* (2006.01)
*G01R 11/16* (2006.01)

(52) U.S. Cl.
CPC ......... *G01D 5/2497* (2013.01); *G01D 5/2515* (2013.01); *G01F 15/066* (2013.01); *G01R 11/16* (2013.01)

(58) Field of Classification Search
USPC .................................................. 324/207.25
See application file for complete search history.

(56) References Cited

U.S. PATENT DOCUMENTS

| | | | |
|---|---|---|---|
| 5,757,180 A | 5/1998 | Chou et al. | |
| 2003/0090265 A1* | 5/2003 | Wan | G01D 5/14 |
| | | | 324/207.25 |
| 2003/0145663 A1* | 8/2003 | Heisenberg | B62D 6/10 |
| | | | 73/862.324 |
| 2010/0321008 A1* | 12/2010 | Mita | G01D 5/145 |
| | | | 324/207.25 |
| 2011/0196648 A1 | 8/2011 | Mayer et al. | |

FOREIGN PATENT DOCUMENTS

| | | |
|---|---|---|
| CN | 102628703 A | 8/2012 |
| CN | 203083583 U | 7/2013 |
| EP | 2295938 | 3/2011 |
| JP | 2005-274249 A | 10/2005 |
| JP | 2012215415 | 11/2012 |
| WO | WO-2014/117734 | 8/2014 |

OTHER PUBLICATIONS

"International Application Serial No. PCT/CN2014/071725, Written Opinion dated Jul. 8, 2014", (w/ English Translation), 13 pgs.
"International Application No. PCT/CN2014/071725, International Search Report dated Jul. 8, 2014 (with translation)", (dated Jul. 8, 2014), 6 pgs.
"European Application No. 14745348.4, Extended European Search Report dated Oct. 10, 2016", (dated Oct. 10, 2016), 8 pgs.

* cited by examiner

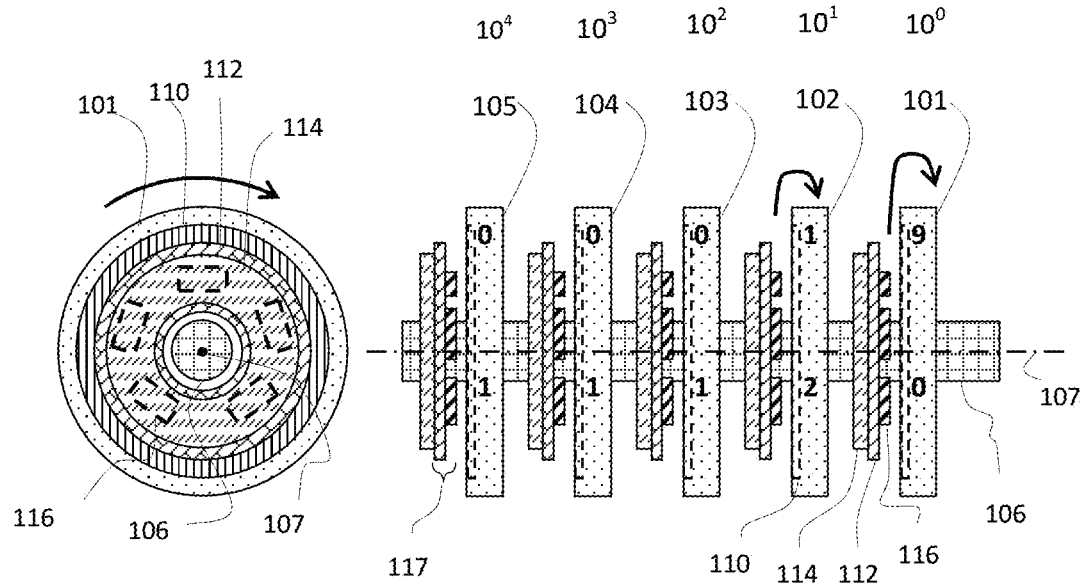
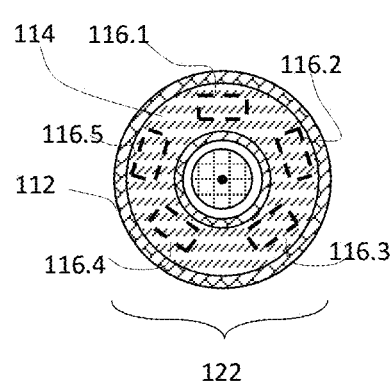
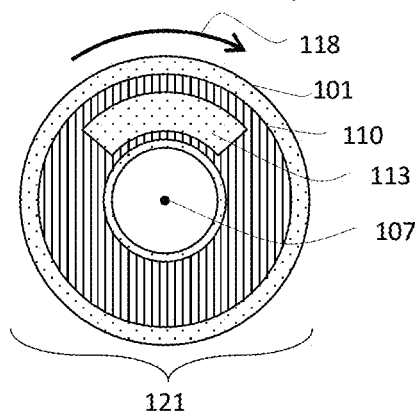
Figure 1A
Figure 1B
Figure 1C
Figure 1D

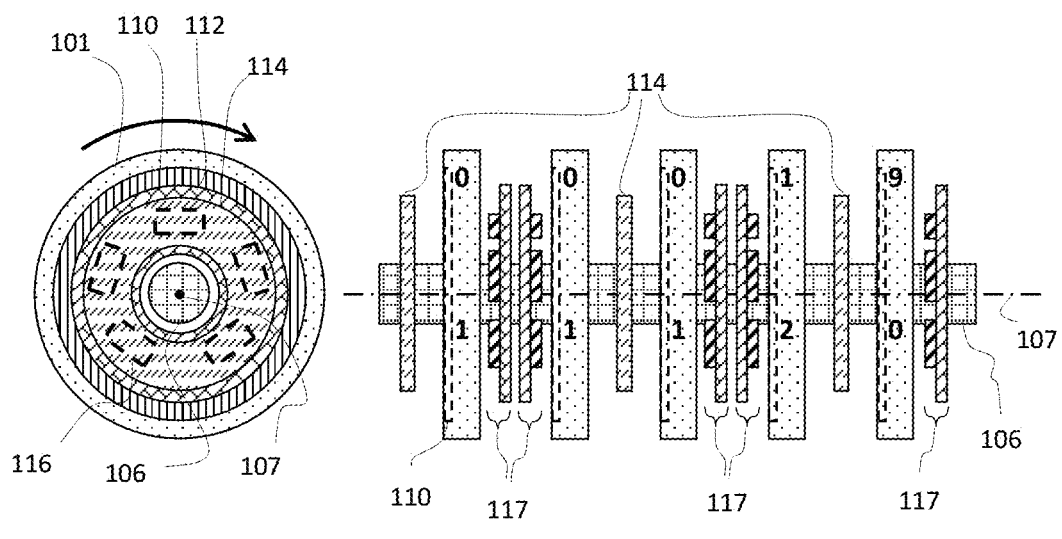
Figure 2A
Figure 2B
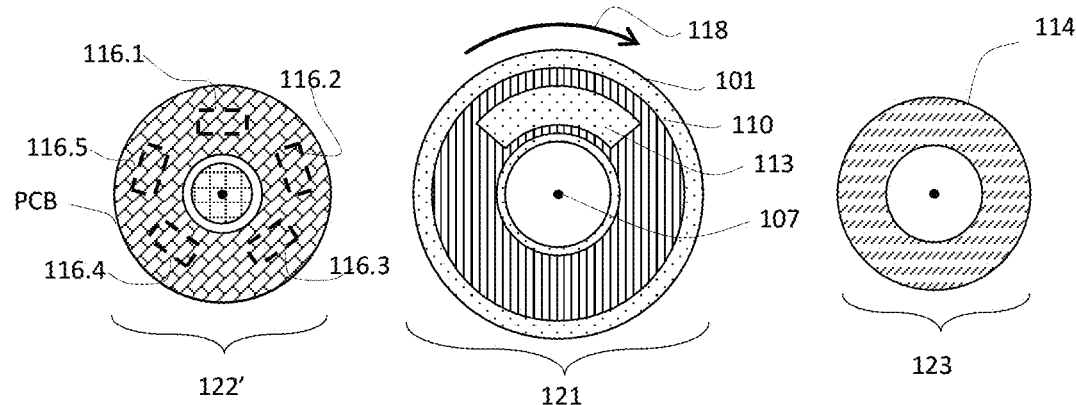
Figure 2C
Figure 2D
Figure 2E

5-Bit Encoder Wheel
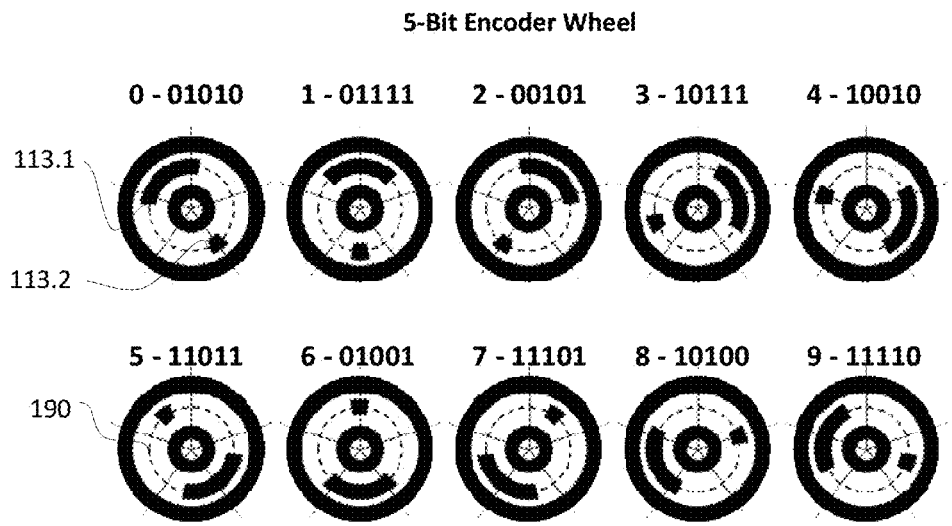
Figure 7A
| Angle | Sensor | Digit | Sensor Output | | | | |
|---|---|---|---|---|---|---|---|
| | | | 1 | 2 | 3 | 4 | 5 |
| 0 | 1 | 0 | 0 | 1 | 0 | 1 | 0 |
| 36 | | 1 | 0 | 1 | 1 | 1 | 1 |
| 72 | 2 | 2 | 0 | 0 | 1 | 0 | 1 |
| 108 | | 3 | 1 | 0 | 1 | 1 | 1 |
| 144 | 3 | 4 | 1 | 0 | 0 | 1 | 0 |
| 180 | | 5 | 1 | 1 | 0 | 1 | 1 |
| 216 | 4 | 6 | 0 | 1 | 0 | 0 | 1 |
| 252 | | 7 | 1 | 1 | 1 | 0 | 1 |
| 288 | 5 | 8 | 1 | 0 | 1 | 0 | 0 |
| 324 | | 9 | 1 | 1 | 1 | 1 | 0 |
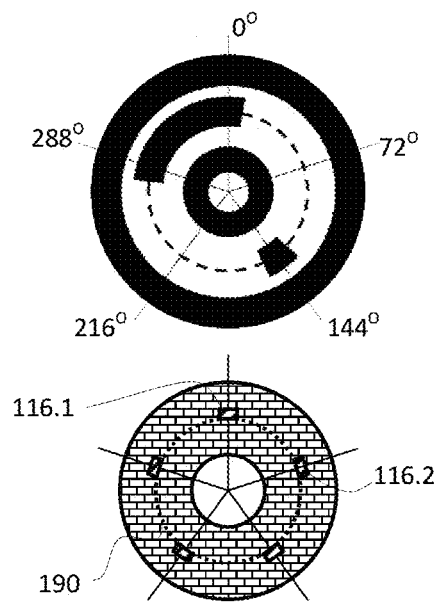
Figure 7B                    Figure 7C

| Angle | Wheel Number | Digit | Sensor Output ||||
|---|---|---|---|---|---|---|
| | | | 1 | 2 | 3 | 4 |
| 0 | 1 | 0 | 1 | 0 | 0 | 0 |
| 36 | | 1 | 1 | 1 | 1 | 1 |
| 72 | 2 | 2 | 0 | 1 | 0 | 0 |
| 108 | | 3 | 1 | 1 | 0 | 0 |
| 144 | | 4 | 0 | 0 | 1 | 1 |
| 180 | 3 | 5 | 0 | 1 | 1 | 0 |
| 216 | | 6 | 1 | 0 | 1 | 0 |
| 252 | | 7 | 0 | 0 | 0 | 1 |
| 288 | 4 | 8 | 0 | 1 | 1 | 1 |
| 324 | | 9 | 1 | 0 | 0 | 1 |

MAGNETIC ABSOLUTE ROTARY ENCODER

PRIORITY CLAIM TO RELATED APPLICATIONS

This application is a U.S. national stage application filed under 35 U.S.C. § 371 from International Application Serial No. PCT/CN2014/071725, which was filed 29 Jan. 2014, and published as WO 2014/117734 on 7 Aug. 2014, and which claims priority to Chinese Application No. 201310040970.X, filed 1 Feb. 2013, which applications and publication are incorporated by reference as if reproduced herein and made a part hereof in their entirety, and the benefit of priority of each of which is claimed herein.

TECHNICAL FIELD

The present invention relates to a rotary encoder. More particularly, the present invention relates to an improved magnetic absolute rotary encoder.

BACKGROUND OF THE INVENTION

Existing encoders may be used in automatic utility meter reading or any application where total flow must be monitored at remote locations over long time periods. They can be included in any device that utilizes rotating wheels to measure cumulative flow of gas or liquid. In these meters, the total number of rotations of the wheels is indicative of the total flow through the meter. Common encoders involving optical, electrical contacts, or inductive mechanisms may be used. Absolute rotary encoders are a subset of rotary encoders, which provide information about the rotational position of each reel at any time, without the need to monitor and count pulses caused by the movement of the wheel. These encoders typically include a rotating wheel and provide an appropriate output of the wheel position. Although there are many possible ways of counting, each wheel's rotation typically represents 10 digits, for example, the encoder wheel can be numbered from 0 to 9. In addition to electronic output, these encoders also may provide visual readings. A common encoder is configured with at least one wheel, if the recording time is long such that several decades of counting is needed, more wheels are necessary. In these multi-wheel arrangements, the first wheel of a pair turns one full rotation, causing the second wheel to turn 0.1 rotations, although a different ratio may be used. Within a multi-wheel meter, generally except for the first wheel, one full rotation of the preceding wheel N will cause the successive N+1 wheel to rotate 0.1 turns. This multi-wheel assembly configured as such can therefore record readings over several decades.

Other encoder technologies are known in the art such as: optical transmission, optical reflectance, electrical contact. Optical methods suffer from problems from dirt and light pollution, and high expense due to needed electronic components for both light source and light detector. Electrical contact encoders suffer from low reliability as they wear out over time. Other magnetic encoder technologies are known in the art such as magnetic targets with alternating magnetizations, and inductive detectors. Magnetic targets are more expensive; their physical precision is limited by the ability to impress a permanent magnetization on the material.

To overcome these shortcomings an improved invention with lower cost, simpler design, and magnetic disks with greater precision will be useful to the flow metering industry.

SUMMARY OF THE INVENTION

The purpose of the present invention is to overcome the above problems of the prior art, to provide an improved electronic absolute magnetic rotary encoder technology. Specific technical improvements include the following: 1) the use of a magnetically permeable "soft" magnetic material with specific geometry instead of permanent magnet encoder wheels, 2) addition of magnetic switch circuitry that reduces output noise near magnetic transitions, 3) inclusion of an optional ferromagnetic flux closure device that reduces magnetic "cross talk" between neighboring wheels, 4) optimization of the encoder disk geometry design according to modeled and measured magnetic field values present near the disk in the plane of the sensing axis, and 5) 4 and 5 sensor designs for decoding 10 distinct rotary positions.

To achieve the above technical objectives, the present invention is realized by the following technical scheme:

A magnetic rotary encoder comprising

A rotation shaft;

A plurality of wheels on the rotation shaft;

A plurality of encoding units one for each of the plurality of wheels; and

For each encoding unit one or more permanent magnets to provide magnetic field bias.

Each encoding unit further comprises:

a permeable magnetic disk structure, wherein the permeability of the disk varies with rotation angle of the disk about the rotation shaft; and multiple magnetic sensor units disposed in the same plane for sensing the magnetic permeability of the encoder disk, thereby outputting a signal characterizing the position of the encoder disk, where the axis of the rotation shaft is perpendicular to the plane of the sensors, Either the permeable magnetic encoder disk or the sensor unit rotates with the wheel, while the other remains stationary.

The output signals of each sensing unit characterize the rotational position of each corresponding wheel.

Preferably, one or more permanent magnet assemblies and the magnetic encoder disk have directions of magnetization respectively aligned parallel to the rotation axis, and the sensing axis of each of the magnetic sensors is substantially parallel to a direction that is radial directed from the rotation axis.

Preferably each sensor unit comprises 4 or 5 magnetoresistive sensors, to detect 10 rotational positions of each wheel.

Preferably, the magnetic rotary encoder includes a plurality of permanent magnet assemblies, with one permanent magnet assembly for each encoding unit.

Preferably, the magnetic rotary encoder provides a separate permanent magnet for each encoder unit to provide magnetic biasing.

Preferably the permanent magnet assembly includes at least one ring shaped permanent magnet or a plurality of permanent magnets arranged in a circle.

Preferably, each of the encoding unit further comprises a flux closure means made of a soft ferromagnetic material.

Preferably, the permeable magnetic encoder disk structure includes at least one slot.

Preferably, the permeable magnetic encoder disk structure includes at least one bump and/or one tab.

Preferably, the permanent magnet assembly made of a material selected from the group of ferrite, barium ferrite, cobalt ferrite, or NdFeB.

Preferably, the permeable magnetic encoder disk made of a material selected from a nickel-iron, soft iron, high permeability magnetic alloys, soft steel, or a soft ferrite.

Preferably, in each encoding unit, a gap of 0.1-4 mm exists between the permeable magnetic encoder disk and the magnetic sensor unit.

According to the present invention, a magnetic rotary encoder with lower cost, simpler operation, and higher accuracy can be obtained.

BRIEF DESCRIPTION OF THE DRAWINGS

FIGS. 1A-1D show the front and end view schematic of multi-wheel rotary encoder assembly, magnets for each wheel.

FIGS. 2A-2E show the front and end view schematic of a second alternative for magnet placement multi-wheel rotary encoder assembly, with shared magnets.

FIGS. 7A-7C show the implementation of the encoding unit of a seventh implementation of a magnetic rotary encoder assembly.

DESCRIPTION OF THE PREFERRED EMBODIMENTS

Figures 3A, 3B:
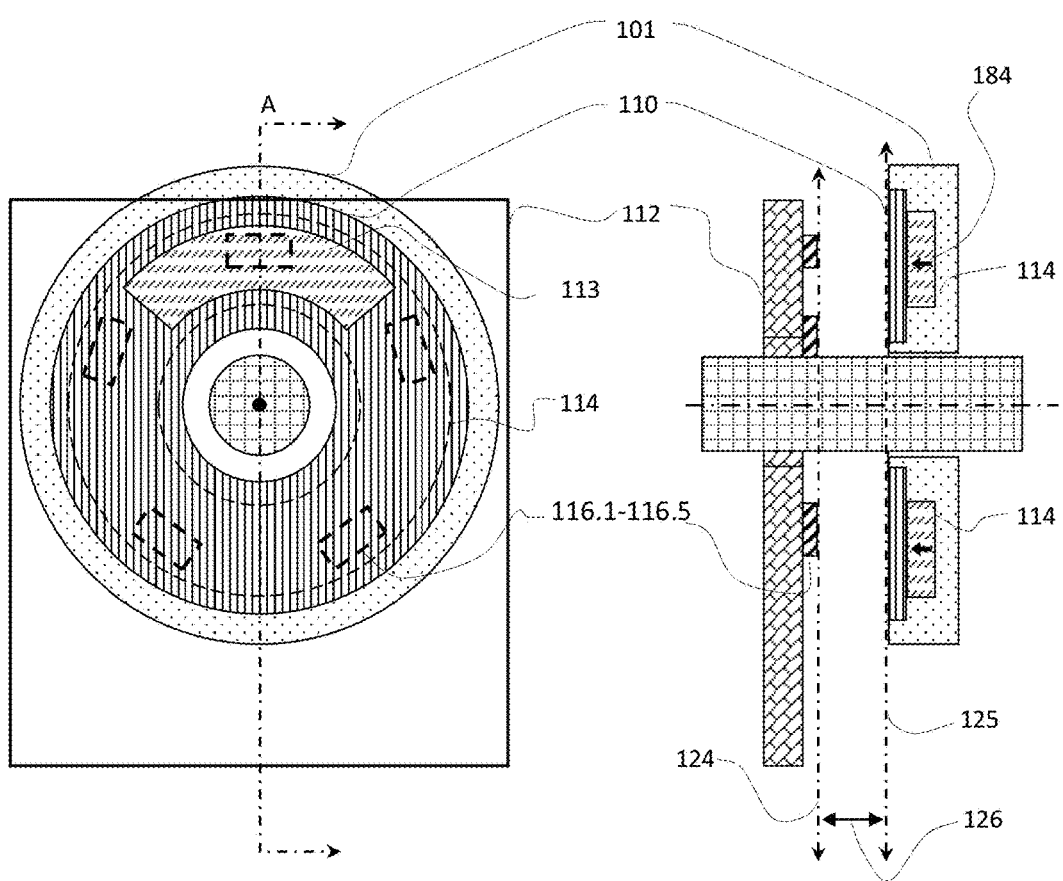
FIGS. 3A-3B show a schematic diagram of the encoding unit of a third implementation of a magnetic rotary encoder assembly.

The invention is described below in detail with reference to the appended drawings and preferred implementation examples. In the drawings, the same or similar reference numerals identify the same or similar components.

FIGS. 1A-1D show the construction of a multi-turn encoder of the present invention, showing different perspective views of the five wheels. FIG. 1 rotary encoder includes an axis of rotation 107, 5 rotatable wheels on the axis of rotation 107 denoted 101, 102, . . . , 105, with one wheel per encoding unit, and one or more permanent magnets 114 to provide magnetic bias per coding unit. The rotary encoder comprises a rotating portion and the fixed portion, where the rotating portion can support the encoder disk, under effect of an external torque it rotates with the wheel on the axis of rotation; the rigidly fixed portion does not rotate about the rotation axis, but is supported by a mounting bracket. Each encoding unit includes a magnetically permeable encoder disk 110 and sensor assembly 117. Magnetically permeable encoder disk 117 has a specific geometry and it is assembled such that it can rotate with respect to the sensing surface of the sensor assembly 117. In order to provide a magnetic bias to the encoder disk 110, an appropriate permanent magnet 114 is chosen such that it will not saturate the magnetic sensors. Hysteretic magnetic switches are placed on a printed circuit board (PCB) 112, the output signal of the switches exhibits two stable states, such that the transition regions of the rotating magnetic field do not produce noise in the electronic output. The magnetically permeable structure 110 on the encoder disk is designed such that its permeability varies as a function of rotational position around the axis of rotation 107. The encoder disk 110 within the wheel is set up with multiple positions corresponding to selected locations about the rotation axis. The permeability encoder disk 110 in each of these positions corresponding to an angle of rotation, has a geometry which provides a unique set of magnetic field configurations onto the plurality of magnetic field sensors in the sensing unit. Sensing unit 117 includes multiple magnetic field sensors 116 set in the same plane, which is perpendicular to the axis of rotation 107. When the permeable encoder disk rotates relative to the sensor assembly 117, the permeability of the encoder disk induces different magnetic fields on the sensor assembly, such that the output signal of the sensors characterizes the position of the encoder disk. The encoder disk and angular positioning of the sensor components can be used to generate a digital code, the magnetic sensor output code thereby representing the angular position of the wheel. The measured signal of each encoding unit output provides a measure of the angular position of the corresponding wheel.

The entire assembly provides a visual and electronic recording of the total number of rotations taken by the right-most wheel 101. The visual recording is taken from the top-most number on each wheel. Thus, the current reading is 00,019 turns. This means the rightmost wheel 101 has already done one complete turn and is almost done with its second turn. We will give it the name "$10^0$" because that is the order of magnitude it represents in a base-10 number. The second wheel from the right, 102, is named "$10^1$". The third wheel from the right, 103, is named "$10^2$". The fourth wheel from the right, 104, is named "$10^3$". The fifth wheel from the right, 105, is named "$10^4$".

The motion of the 102 wheel 102 is coupled to the motion of the 101 wheel with the ratio of 10:1. This means $10^0$ wheel 101 makes ten revolutions for every 1 revolution of $10^1$ wheel 102. In the same way, $10^1$ wheel 102 makes ten revolutions for every 1 revolution of $10^2$ wheel 103. More generally, the $10^n$ wheel makes ten revolutions for every 1 revolution of $10^{n+1}$. While this drawing shows a five-wheel encoder, the same description could easily apply to one with any number of wheels.

Example 1

A first example of a preferred embodiment of the present invention, has one permanent magnet for each coding unit.

As shown in FIG. 1, each rotor has a permanent magnet count corresponding thereto, i.e. each encoding unit corresponds to the permanent magnet. FIG. 1A shows an end-on view of the five wheels illustrated on the right side as FIG. 1B which shows a side view of the rotary encoder device 100. In order to more easily see the two parts of the wheel, the wheel is broken into two parts illustrated in FIGS. 1C and 1D. In this embodiment, the piece shown in FIG. 1C is a the fixed portion, and that shown in FIG. 1D is a rotating portion. All of the wheels 101, 102, . . . , 105 rotate on shaft 106 whose axis is co-axial with the axis of rotation 107. Magnetically permeable disk 110 is mounted on wheel 101 so that the permeable disk 110 and wheel 101 rotate together about axis 107. Magnet 114 is mounted in a way that is does not rotate, but rather is fixed to an external support. Printed circuit board (PCB) 112 is also fixed. Five magnetic sensors, 116.1, 116.2, 116.3, 116.4, 116.5, are physically attached to PCB 112 which also provides electrical interconnections for sensors 116. The combination of PCB 112 and sensors 116 is called the sensor unit 117. The sensor unit 117, together with fixed magnet 114 forms 122, the fixed assembly.

Disk 110 has structural variation 113. This structural variation is a geometrically distinct pattern formed in magnetically soft permeable disk 110. The purpose of this variation is to cause a change in the magnetic field measured by the nearby sensors as the disk rotates about axis 107. The variation must be distinct and precise for the invention to function properly. It must be formed in a way that provides a unique set of magnetic fields to the 5 sensors at each of the 10 positions of angular rotation. Further details of the magnetic encoding design will be discussed in later diagrams. The disk 110 and wheel 101 together form the rotating assembly 121. This assembly rotates about the axis 107 in the angular direction indicated by arrow 118, wheel rotation.

Example 2

Magnetic rotary encoder preferred implementation example 2 provides a permanent magnet that is shared by two wheels.

A different arrangement of fixed magnets 114 is shown in FIG. 2. The upper left part of FIG. 2 shows an end on view of the 5-wheel assembly whose side view is in the upper right. The end-on view is broken into three parts in the lower half of FIG. 2 in order to more easily see the parts of the wheel clearly. The lower left and lower right of FIG. 2 have the two portions of the wheel that are fixed, and the lower center has the portion that rotates. Here, the fields from one of magnets 114 are detected by two sensor assemblies 117. This saves space and cost in a multi-wheel assembly. In this arrangement, magnet 114 is the only component of a separate fixed assembly 123. Rotating assembly 121 is constructed the same as in FIG. 1. The sensor assemblies 117 form fixed assembly 122'.

In a multi-wheel magnetic rotary encoder, the arrangement used in this embodiment saves space and cost.

The arrangement used in this embodiment may be used in conjunction with other embodiments.

Example 3

Magnetic rotary encoder preferred implementation example 3 provides a magnet is located on the wheel, and the encoder disk can be rotated together with the rotor about a rotation axis, and the sensor unit comprises five sensors, as shown in FIG. 3.

FIG. 3A is a right side view of a coding unit, and FIG. 3B is a cross-sectional view taken along the direction A in FIG. 3A. PCB 112 is drawn in outline only at left in order to enable a clearer view of the other components. In this arrangement, magnet 114 is placed on wheel 101 in very close proximity to, or touching, disk 110; these components rotate together about the axis 107. PCB 112 is shown as a rectangular form in FIG. 3. If designed with a mechanical connection means, PCB 112 can serve the purpose of structural support for the wheel assembly in addition to providing electrical connections for sensors 116.1-116.5.

The active elements in sensors 116 are present near the surface furthest away from the PCB 112. They are sensitive in a direction perpendicular to the axis of rotation. The plane that passes through the sensing elements and is parallel to the sensing axis of each sensor is called the sensing plane, 124, The sensing axis of each sensor is designed to be parallel to the radial direction in this figure, which corresponds to the short direction of each sensor. This convention will be used throughout the remainder of this technical description.

The magnet 114 in this embodiment is similar in shape to the ring magnets shown in FIGS. 1 and 2. The orientation of the magnetization vector 184 of magnet 114 is substantially parallel to the rotation axis 107, and nominally uniform within the body of the magnet 114. The stray fields from magnet 114 are also substantially parallel to the rotation axis 107. The permeable magnetic encoder disk 110 rotates such that its face is in a disk plane 125, which is parallel to sensing plane 124. These two planes are set apart mechanically at a designed distance from one another. This space between planes 124 and 125 is called the Gap, and has the designed distance shown as G, 126. With this single large ring magnet design, the magnetic field effect from the magnet at each of the 5 sensors is identical regardless of the angular position; this fact can be understood by observing the angular symmetry of ring magnet 114 with respect to sensors 116. Any variation in magnetic field at a sensor as disk 110 rotates is due only to variation 113.

Some possible materials for permanent magnet 114 include barium ferrite, cobalt ferrite, neodymium iron boron, ferrite, and any other common permanent magnet material that retains significant magnetization after a saturating magnetizing field is removed, and require a relatively large magnetic field to saturate its magnetization. Some possible materials for the permeable magnetic encoder disk 110 are: permalloy, soft iron, mu metal, soft steel, soft ferrite. Here, "magnetically soft" means that the residual net magnetization is very small compared to its saturation magnetization; and a relatively small magnetic field will saturate the magnetization.

Example 4

Figures 4A, 4B:
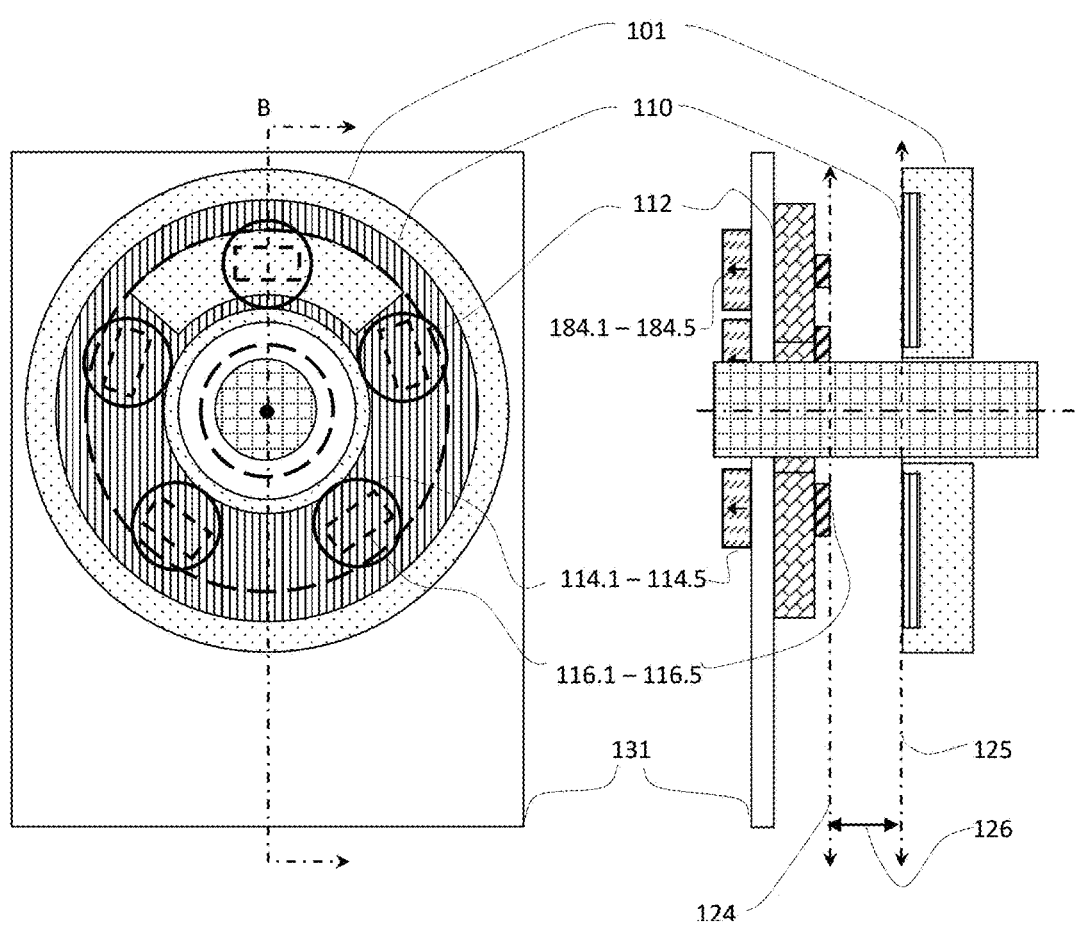
FIGS. 4A-4B show a schematic diagram of the encoding unit of a fourth implementation of a magnetic rotary encoder assembly.

A fourth implementation including 5 small permanent magnets and 5 sensors on fixed assembly is shown in FIG. 4. FIG. 4A is a right side view showing the fourth embodiment of the encoding unit, and FIG. 4B is a cross-sectional view along the direction A in FIG. 4A. Mechanical support 131 is drawn in outline only at left in order to enable a clearer view of the other components. Also drawn in outline only are 5 small permanent magnets 114.1, 114.2, 114.3, 114.4, 114.5, and PCB 112. In this arrangement, small disk magnets 114.1-114.5 are placed on mechanical support 131 and located such that their axis of symmetry is parallel to the rotation axis 107 and passes through one of corresponding sensors 116.1-116.5. Both magnets 114 and sensors 116 are on the mechanically fixed assembly. PCB 112 is shown as a circular form in this figure. It provides electrical connections for sensors 116.1-116.5; it is structurally attached to and supported by mechanical support 131.

The sensing assembly design in the present example is the same as for the previous example 3. The active elements in sensors 116.1-116.5 are present near the surface furthest away from the PCB 112. They are sensitive in the plane parallel to the PCB. The plane that passes through the sensing elements and is substantially parallel to the sensing axis of each sensor is called the sensing plane, 124. The sensing axis of each sensor is designed to be parallel to the radial direction in this figure, which corresponds to the short direction of each sensor. The disk face nearest the sensor is in disk plane 125. The spacing between planes 124 and 125 is called the Gap, and has the designed distance shown as G 126.

The permanent magnet biasing design in this example has several differences from the ring magnets shown in FIGS. 1 and 2. The orientation of magnetization vectors 184.1, 184.2, 184.3, 184.4, 184.5 of magnets 114.1, 114.2, 114.3, 114.4, 114.5, respectively, are parallel to the rotation axis 107, and nominally uniform within the body of the magnets 114.1-114.5. The stray fields from magnets 114.1-114.5 are also largely parallel to the rotation axis 107, though some bending of magnetic field lines is unavoidable. The permeable magnetic encoder disk 110 rotates such that its face is in a disk plane 125, that is parallel to sensing plane 124. These two planes are set apart mechanically at a designed distance G, 126, from one another. With this 5-small magnet biasing design, the magnetic field effect from the permanent magnets at each of the 5 sensors is identical regardless of the angular position because the magnets 114.1-114.5 are mounted rigidly to the fixed sensor assembly 117. Any variation in magnetic field at a sensor as disk 110 rotates is due only to variation 113.

This magnetic bias design has the biasing magnets 114.1-114.5 outside Gap 126, but biasing magnets 114.1-114.5 are behind sensors 116.1-116.5 rather than behind disk 110 as in example 3.

The selection choices of magnet and disk materials for the present example 4 are the same as for example 3. In the present embodiment, there is one small permanent magnet for each sensor, that is, 5 permanent magnets and t5 sensors. In principle, this situation applies to any number of sensors and permanent magnets, one embodiment that will be described later uses 4 permanent magnets and 4 sensors.

Example 5

Figures 5A, 5B:
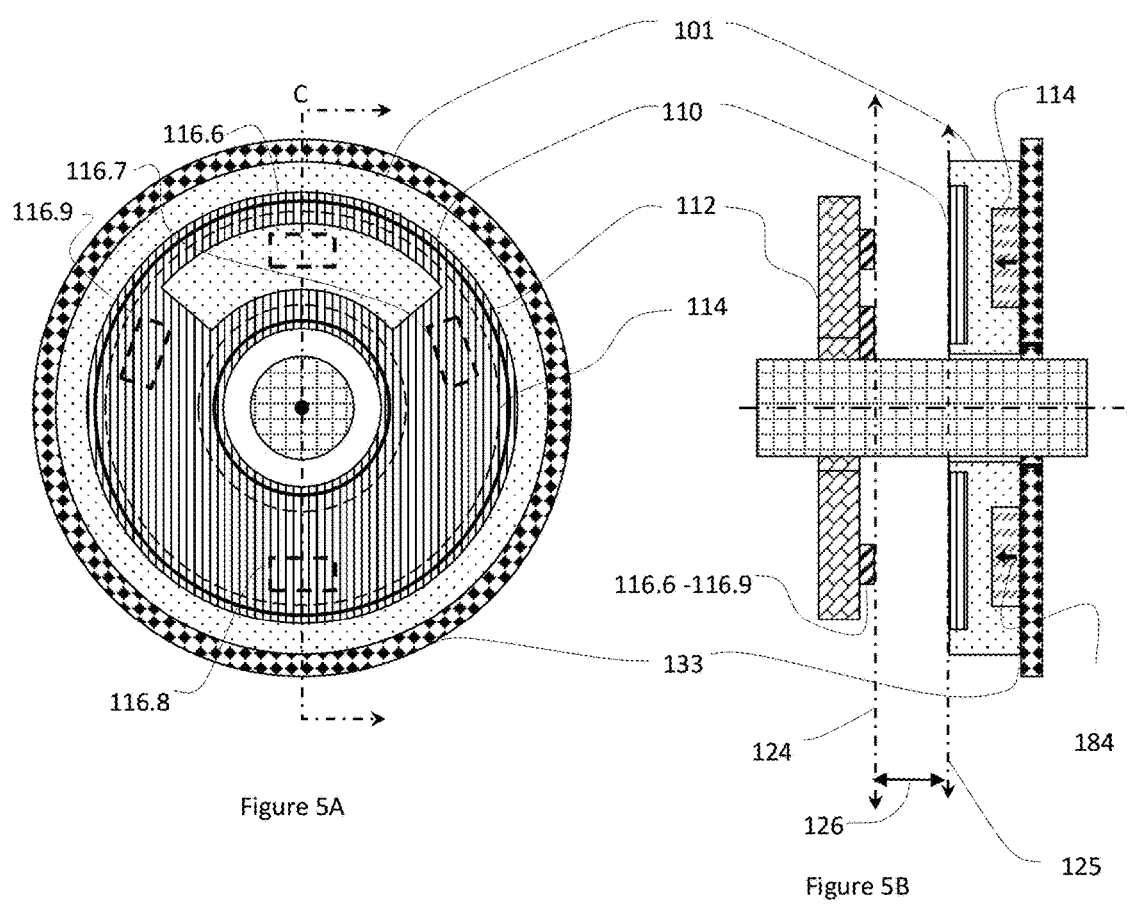
FIGS. 5A-5B show a schematic diagram of the encoding unit of a fifth implementation of a magnetic rotary encoder assembly.

A fifth implementation is shown in FIG. 5, including fours sensors on a fixture and large ring magnet on the rotating wheel. FIG. 5A is a right side view of the embodiment of the encoding unit 5, and FIG. 5B is a cross-sectional view taken along the direction A in FIG. 5A. The distinctive features in this example are an optional flux closure plate 133, the use of only 4 sensors 116.6-116.9, and moving ring magnet away from disk 110 compared to example 3. PCB 112 is shown as a circular form in this diagram. It provides electrical connections for sensors 116.6-116.9.

The sensing assembly design in the present example is the similar to that in the previous example 4 with the obvious difference of having 4 sensors rather than 5. The active elements in sensors 116.6-116.9 are present near the surface furthest away from the PCB 112. They are sensitive in the plane parallel to the PCB. The plane that passes through the sensing elements and is parallel to the sensing axis of each sensor is called the sensing plane, 124. The sensing axis of each sensor is designed to be parallel to the radial direction in this figure, which corresponds to the short direction of each sensor. The disk face nearest the sensor plane is in disk plane 125. The space between planes 124 and 125 is called the Gap, and has the designed distance shown as G 126.

The magnet 114 in this design is similar in shape to the ring magnets shown in FIGS. 1 and 2. The magnetic biasing design is similar to Example 3. The orientation of the magnetization vector 184 of magnet 114 is parallel to the rotation axis 107, and nominally uniform within the body of the magnet 114. The stray fields from magnet 114 are also largely parallel to the rotation axis 107, though some bending of magnetic field lines is unavoidable. The permeable magnetic encoder disk 110 rotates such that its face is in a disk plane 125, which is parallel to sensing plane 124. These two planes are set apart mechanically at a designed distance from one another. With this single large ring magnet design, the magnetic field effect from the magnet at each of the 4 sensors 116.6-116.9 is identical regardless of the angular position; this fact can be understood by observing the angular symmetry of ring magnet 114 with respect to sensors 116.6-116.9. Any variation in magnetic field at a sensor as disk 110 rotates is due only to variation 113.

An added feature in this example is magnetic flux closure plate 133. The plate is made from soft magnetic materials, similar to those used for disk 110 though not necessarily identical. But the purpose of plate 133 is to reduce the magnetic reluctance path for magnetic flux coming from the back side of bias magnet 114. The back side is furthest away from Gap 126. This flux closure performs a few functions including: reducing stray magnetic fields present at other wheels in the assembly (102 and beyond), reducing magnetic interference from other sources including outside magnetic fields, increasing the efficiency of delivery of magnetic flux from magnet 114 to the desired region.

The selection choices of magnet and disk materials for the present Example 5 are the same as for Example 3. The selection material choices for flux closure plate 133 are similar to that of soft permeable disk 110.

The features of this specific embodiment may be used in conjunction with other embodiments.

Example 6

In this Example 6, the fixed device has four sensors and four small permanent magnets. This embodiment does not use a drawing because it combines the implementations shown in FIGS. 4 and 5 into a single design. It uses the same sensor positions shown in FIG. 5A, that is 116.6-116.9, having the same angular positions about the axis of rotation 107. The 4 small permanent magnets are positioned analogously to those in FIGS. 4A and 4B. As can be seen from FIG. 4, a small permanent magnet 114.1-114.5 is installed on the rear of bracket 131 each centered with respect to the corresponding center of the sensors 116.1-116.5. In order to make such a design suitable for the present embodiment, the position of the center of each of the 4 small permanent magnets should be the same as the center of each of the corresponding 4 sensors 116.6-116.9. To summarize, in this embodiment, there is no large ring magnet 114.

The following two examples, 7 and 8, show the magnetic biasing design and the magnetic encoding design in more detail. Example 7 shows a 5-sensor design in FIGS. 6, 7, and 8, Example 8 shows a 4-sensor design in FIGS. 9, 10, and 11.

Example 7

Figures 6A, 6B:
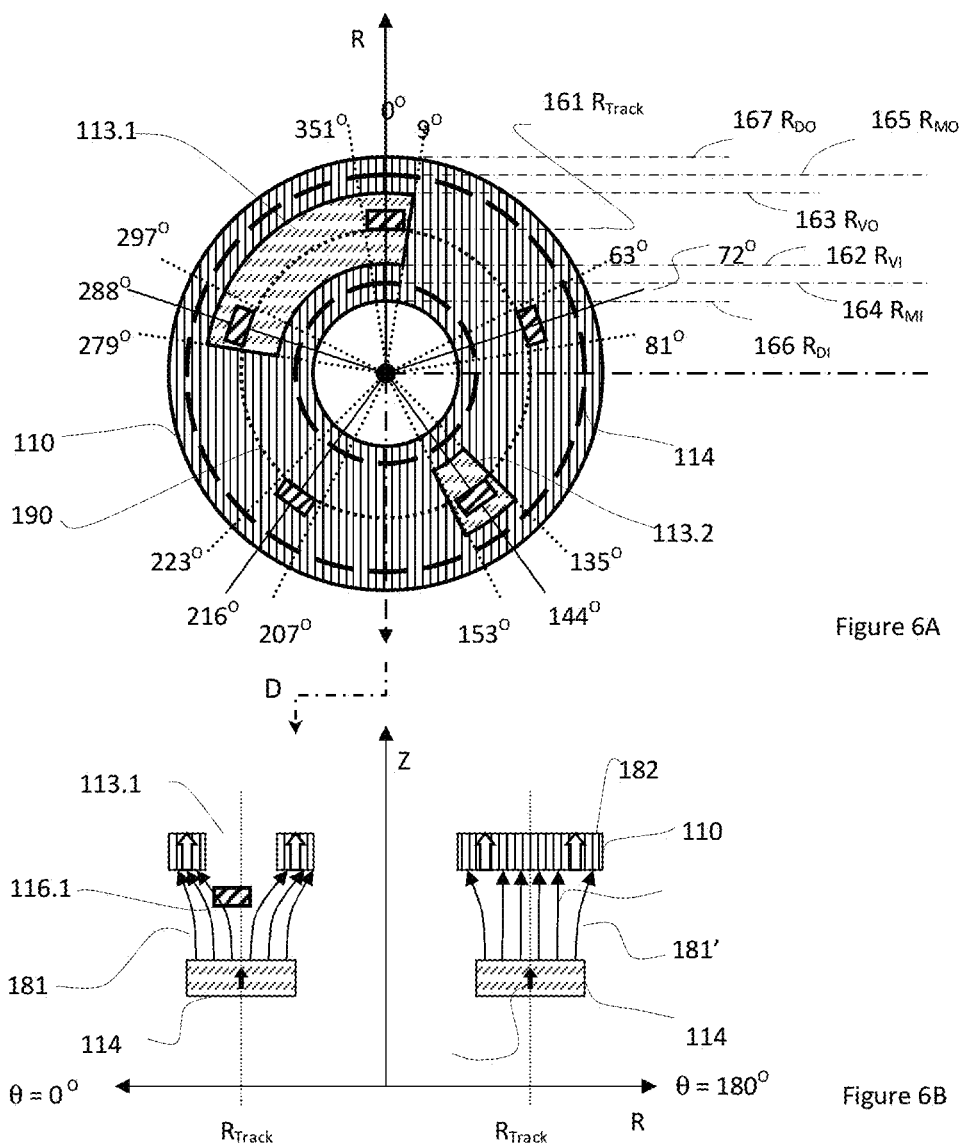
FIGS. 6A-6B show a schematic diagram of the encoding unit of a seventh implementation of a magnetic rotary encoder assembly.

FIGS. 6A and 6B show an right-side and cross section view of disk 110, magnet 114, and sensors 116.1-116.5. The purpose is to explain the magnetic biasing design and the magnetic encoding design, and how the location and orientation of magnetic sensors is related to these designs. Cross section D, shown in the FIG. 6B, is taken from FIG. 6A. The horizontal axis below, labeled R, is taken from the line passing though θ=0° and θ=180° in the upper diagram. The vertical Z axis in FIG. 6B is the out-of-plane direction in the upper diagram taken along rotation axis 107 of FIG. 6A.

Several important values for radii are given in FIG. 6A. The disk 110 has an inner radius labeled 166 $R_{DI}$, and outer radius labeled 167 $R_{DO}$. Ring magnet 114 has an inner radius labeled 164 $R_{MI}$, and an outer radius labeled 165 $R_{MO}$. Variations 113.1 and 113.2 have an inner radius labeled 162$R_{VI}$, and an outer radius labeled 163 $R_{VO}$. A dashed circle called 190 Track, has a radius labeled 161 $R_{Track}$. Track 190 is a non-physical marking showing the circle of radial symmetry of ring magnet 114 and disk 110. $R_{Track}$ 161 is exactly halfway between 166 $R_{DI}$ and 167 $R_{DO}$, and halfway between 162 $R_{VI}$ and 163 $R_{VO}$. This symmetry is not required for the design to work, but it does simplify the description and understanding of the magnetic fields in the vicinity of these objects.

The magnetic biasing design is shown in FIG. 6B. Magnet 114 is a permanent magnet having a magnetization orientation 184 that is parallel to the Z axis, and rotation axis 107. This orientation is indicated by the solid arrow in the body of magnet 114. Magnetic disk 110 is a "soft magnetic material" meaning it only has significant internal magnetization if an external field is applied. The internal magnetization of disk 110 is called disk magnetization 182 and is indicated by the white hollow arrows in its body. Referring to the top diagram again, one can see that at θ=0° there is a sensor 116.1 and variation 113.1 in disk 110. One can see that at θ=180°, there is no sensor, and no variation either. These differences are shown in the bottom figure.

The behavior of magnetically soft ferromagnetic plate in the presence of a large amplitude magnetic field from a nearby parallel plate is well known in the literature. The magnetization 182 of disk 110 is parallel to the magnetization 184 of magnet 114. The magnetic fields 181' between two such magnetized parallel plates is also parallel to the magnetization 184. This is true to the extent that the plates are close together compared to the radial dimensions of the plates. As one get closer to the edges of magnet 114, fields 181' are non-uniform and are "spreading" away from the magnet. At radius $R_{Track}$ at the magnet 114 is a uniform magnetic field. This behavior of fields 181' is shown on the right half of FIG. 6B.

In contrast, on the left half of FIG. 6B, magnetic fields 181 are not uniform between the magnet 114 and disk 110. This is due to the presence of variation 113.1. The variation 113.1 causes there not to be a parallel plate arrangement like on the right side. Instead, the magnetic flux lines tend to follow the path of lowest magnetic reluctance (that is, through the path with material having the greatest magnetic permeability). This path looks something like the field lines 181 shown on the left half of the bottom figure. Note that there are magnetic field lines, not shown here for clarity, coming into the bottom of magnet 114 and going out of the top of disk 110. These omitted magnetic field lines complete the magnetic flux loops generated by permanent magnet 114.

The sensors 116.1-116.5 are placed in order to have their axis of sensitivity be parallel to the radial direction R at the particular angle they are located. They have no sensitivity in the Z direction and θ direction. FIG. 6A shows the angles at which each sensor is placed, thus their direction of sensitivity. They are [sensor:angle of sensitivity (degrees)]: [116.1, 0], [116.2, 72], [116.3, 144], [116.4, 216], [116.5, 288]. They are placed at a radius slightly larger than 161 $R_{track}$. Referring to FIG. 6B, one can see that the magnetic fields just outside of $R_{Track}$ are bending outward to greater R on the left half (θ=0°) and not bending at all on the right half (θ=180°). The bending of the field in the positive radial direction means there is a small component of the total field that is parallel to the positive radial direction for θ=0°. Magnetic modeling results for this radial component $B_{Radial}$ at the sensor location, are plotted as curve 191 in FIG. 8 below. The sensor 116.1 is sensitive to $B_{Radial}$ but not $B_z$ by design. If a sensor was placed at a radius just greater than $R_{Track}$ on the RIGHT half of the lower diagram (θ=180°), it would not detect any field because $B_{Radial}$ is 0 at θ=180°. In summary, as the disk 110 rotates with respect to the fixed sensors 116.1-116.5, the magnitude of magnetic field detected by the sensors is small but greater than zero when a particular sensor is near a variation, and much closer to zero when that sensor is not near a variation.

Therefore, magnetic sensors can detect the presence and absence of variations in soft magnetic permeable disks as they those disks rotate with respect to the sensors. This effect is used to design magnetic encoders. Each of the sensors, arrayed at specific angular locations, provide an electronic signal that differs from one disk position to the next. Electronic circuitry can convert the analog signals from the magnetic sensors to digital 1/0 to signal "variation" or "no variation". Further, one can make a set of variations 113.1 and 113.2 such that the set of signals from sensors 116.1-116.5 are different for each of the 10 positions of the encoder wheel 101 as it and disk 110 rotate with respect to the fixed sensors.

A summary diagram of such an encoding scheme is shown in FIG. 7. FIG. 7A shows 10 different angular positions of disk 110 with respect to sensors 116.1-116.5. The table in FIG. 7B has a column for "Digit" which corresponds to the number showing on the wheel for each of these 10 positions. The "Degrees" column is the amount of rotation θ that has occurred from the θ=0° position. The "sensor number" column shows the number of sensors on the fixed circuit board for a given angular location. The sensor output value columns show what signal is output from each of the 5 sensors. These 5 values together make a "code" of "1's and "0"s at each Degree. These five-digit codes are placed in the labels above each of the circles in FIG. 7A. For example for digit 4 (upper row, far right) starting at θ=0° and going clockwise from sensor sensors 116.1 and 116.4 see no structural variation, sensors 116.2, 116.3, and 116.5 correspond to regions with structural change. This occurs at angular rotation value θ=144° and results in an output code of 10010.

Figure 8A:
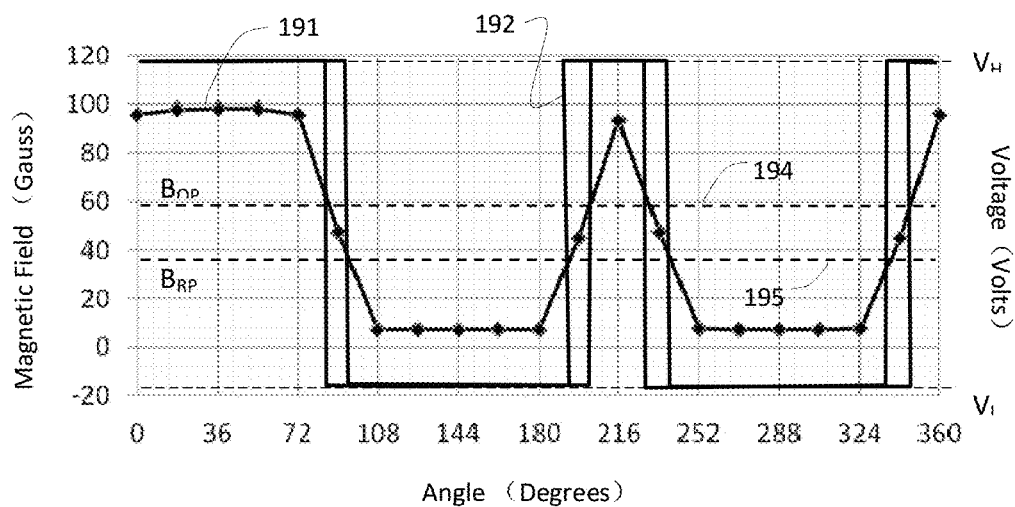
FIGS. 8A-8B show the response curve of the seventh implementation of a magnetic rotary encoder assembly.

FIG. 8 shows the relationship between the magnetic field and the output of the 5-sensor sensing units. When the disk rotates through an entire rotation from θ=0° to θ=360°. The rotation angle of disk 110 is on the bottom axis of the plot. On the left axis is the resulting $B_{Radial}$ from a magnetic field model. Magnetic field (Gauss) vs. Angle (Degrees) is plotted in the heavy solid line with diamond data labels, curve 191. The right axis is the sensor voltage output of a magnetic switch sensor which has been described in the art. Sensor output voltage (volts) vs. Angle (degrees) is plotted as the fine curve 192.

Figure 8B:
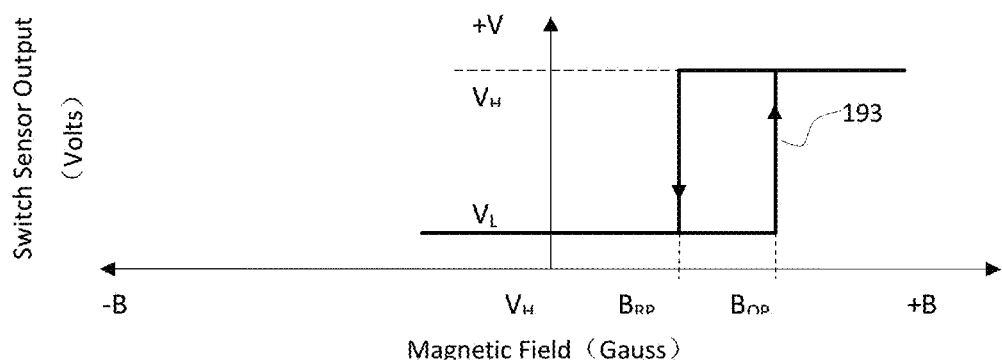

FIG. 8B shows a plot containing a representative response from a commercial digital magnetic switch to an applied magnetic field. This switch converts an analog value of magnetic field to a digital (two-state) electronic output. The horizontal axis is magnetic field (gauss), the vertical axis is Switch Sensor Output (Volts). The output voltage of a digital magnet switch vs. applied magnetic field is plotted here as curve 193. Note that there is hysteresis in the curve. When the applied magnetic field is negative, the output is low at value $V_L$. As the field increases, becomes positive, and increases beyond the defined field Operate Point $B_{OP}$, the sensor output switches from low to high, $V_H$. Then, as the magnetic field decreases from a large positive value, the output switches back to $V_L$ at a field value of B Reset Point or $B_{RP}$. The two magnetic field switching threshold values $B_{OP}$ and $B_{RP}$, are plotted as dashed lines 194 and 195 on the upper plot. So, when sensor external field curve 191 crosses the $B_{OP}$ and $B_{RP}$ dashed lines, the sensor output behaves accordingly as shown in curve 193.

There are many ways to use this invention that involve modifications of the underlying concept shown in this example. For instance, one could invert the "1"s and "0"s for a different digital code. The rotation could be done counter-clockwise rather than clock-wise. The sensors could rotate on the wheel while the disk remains fixed. All of these kinds of devices, though not explicitly described in detail here, would still be within the spirit and scope of the present invention.

Example 8

Example 8 has two differences compared to Example 7: It uses 4 sensors rather than 5, and it has an encoder disk design with 3 variations. These concepts are described in FIGS. 9, 10, and 11.

Figure 9A:
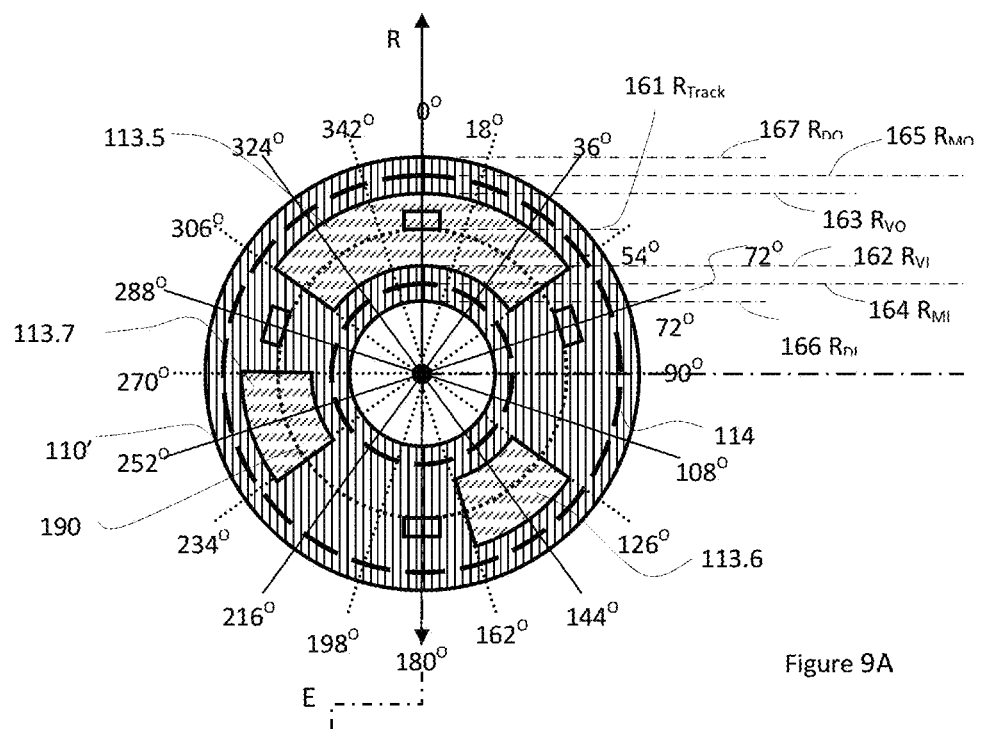
FIGS. 9A-9B show a schematic diagram of the encoding unit of an eighth implementation of a magnetic rotary encoder assembly.
Figure 9B:
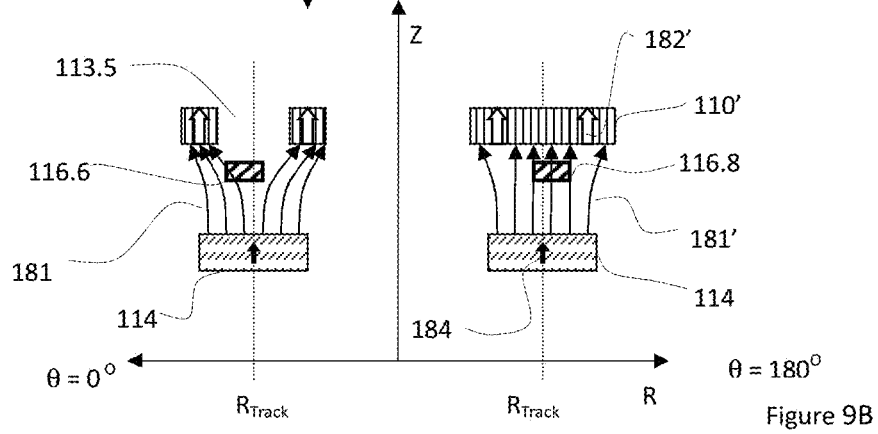

FIGS. 9A and 9B show a right-side and cross sectional view of disk 110', magnet 114, and sensors 116.6-116.9. The purpose is to explain the magnetic biasing design and the magnetic encoding design, and how the location and orientation of magnetic sensors is related to these designs. Cross section E in FIG. 9B comes from FIG. 9A. The horizontal axis below, labeled R, is taken from the line passing though $\theta=0°$ and $\theta=180°$ in FIG. 9A. The vertical Z axis in FIG. 9B is the out-of-plane direction in FIG. 9A taken along rotation axis 107.

FIG. 9A illustrates several radius values. The disk 110' has an inner radius labeled 166, $R_{DI}$, and outer radius labeled 167 $R_{DO}$. Ring magnet 114 has an inner radius labeled 164 $R_{MI}$, and an outer radius labeled 165 $R_{MO}$. Variations 113.5, 113.6 and 113.7 have an inner 162 $R_{VI}$, and outer radius labeled 163 $R_{VO}$. A dashed circle called 190 Track, has a radius labeled 161 $R_{Track}$. Track 190 is a non-physical marking showing the circle of radial symmetry of ring magnet 114 and disk 110'. $R_{Track}$ 161 is exactly halfway between 166 $R_{DI}$ and 167 $R_{DO}$, and halfway between 162 $R_{VI}$ and 163 $R_{VO}$. This symmetry is not required for the design to work, but it does simplify the description and understanding of the magnetic fields in the vicinity of these objects.

The magnetic biasing design is shown in FIG. 9B. Magnet 114 is a permanent magnet having a magnetization orientation 184 that is parallel to the Z axis, and rotation axis 107. This orientation is indicated by the solid arrow in the body of magnet 114. Magnetic disk 110' is a "soft magnetic material" meaning it only has significant internal magnetization if an external field is applied. The internal magnetization of disk 110' is called disk magnetization 182' and is indicated by the white hollow arrows in its body. Referring to FIG. 9A again, one can see that at $\theta=0°$, there is a sensor 116.6 and variation 113.5 in disk 110'. One can see that at $\theta=180°$, there is a sensor 116.8, and no variation. These differences are shown in the bottom figure.

The behavior of magnetic soft magnetic plate in the presence of a large amplitude magnetic field from a nearby parallel plate is well known in the literature. The magnetization 182' of disk 110' is parallel to the magnetization 184 of magnet 114. The magnetic fields 181' between two such magnetized parallel plates is also parallel to the magnetization 184. This is true to the extent that the plates are close together compared to the radial dimensions of the plates. As one get closer to the edges of magnet 114, fields 181' are non-uniform and are "spreading" away from the magnet. This behavior of fields 181' is shown on the right side of FIG. 9B.

In contrast, on the left side of FIG. 9B, magnetic fields 181 are not uniform at disk radius $R_{Track}$ between the magnet 114 and disk 110'. This is due to the presence of variation 113.5. The variation 113.5 causes there not to be a parallel plate arrangement like on the right side. Instead, the magnetic flux lines tend to follow the path of lowest magnetic reluctance (that is, through the path with material having the greatest magnetic permeability). This path looks something like the field lines 181 shown on the left half of the bottom figure. Note that there are magnetic field lines, not shown here for clarity, coming into the bottom of magnet 114 and going out of the top of disk 110'. These un-shown magnetic field lines complete the magnetic flux loops generated by permanent magnet 114.

The sensors 116.6-116.9 are placed in order to have their axis of sensitivity be parallel to the radial direction R at the particular angle they are located. They have zero sensitivity in the Z direction and $\theta$ direction. FIG. 9A shows the angles at which each sensor is placed, thus their direction of sensitivity. They are [sensor:angle of sensitivity (degrees)]: [116.6, 0], [116.7, 72], [116.8, 180], [116.9, 288]. They are placed at a radius slightly larger than 161 $R_{track}$. Referring to FIG. 9B, one can see that the magnetic fields just outside of $R_{Track}$ are bending outward to greater R on the left half ($\theta=0°$) and not bending at all on the right half ($\theta=180°$). The bending of the field in the positive radial direction means there is a small component of the total field that is parallel to the positive radial direction for $\theta=0°$. Magnetic modeling results for this radial component $B_{Radial}$ at the sensor location, are plotted as curve 191' in FIG. 11 below. The sensors 116.6 and 116.8 are sensitive to $B_{Radial}$ but not $B_z$ by design. Sensor 116.8 is placed at a radius just greater than $R_{Track}$ in FIG. 9B ($\theta=180°$), it does not detect any field because $B_{Radial}$ is 0 at $\theta=180°$. In summary, as the disk 110' rotates with respect to the fixed sensors 116.6-116.9, the magnitude of magnetic field detected by the sensors is small but greater than zero when a particular sensor is near a variation, and much closer to zero when that sensor is not near a variation.

Therefore, magnetic sensors can detect the presence and absence of variations in soft magnetic permeable disks as they those disks rotate with respect to the sensors. This effect is used to design magnetic encoders. Each of the sensors, arrayed at specific angular locations, provide an electronic signal that differs from one disk position to the next. Electronic circuitry can convert the analog signals from the magnetic sensors to digital 1/0 to signal "variation" or "no variation". Further, one can make a set of variations 113.5, 113.6, and 113.7 such that the set of signals from sensors 116.6-116.9 are different for each of the 10 positions of the encoder wheel 101 as it and disk 110' rotate with respect to the fixed sensors.

Figure 10A:
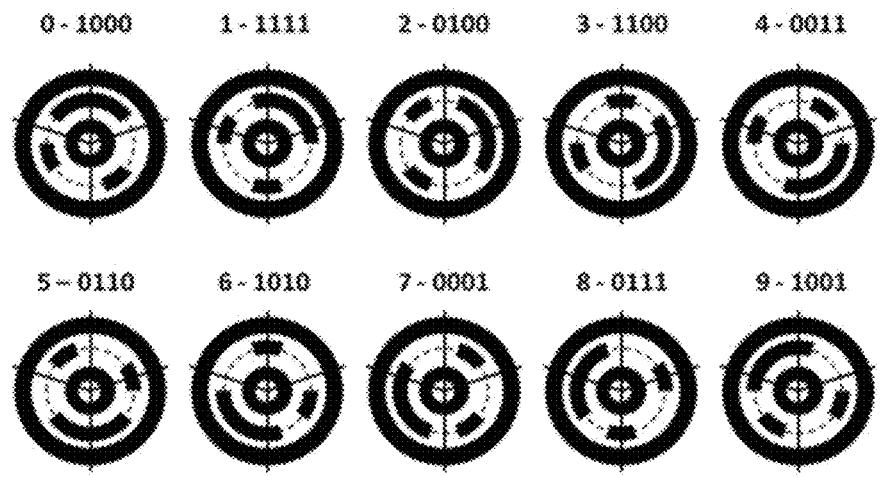
FIGS. 10A-10C show the implementation of the encoding unit of an eight implementation of a magnetic rotary encoder assembly.
Figures 10B, 10C:
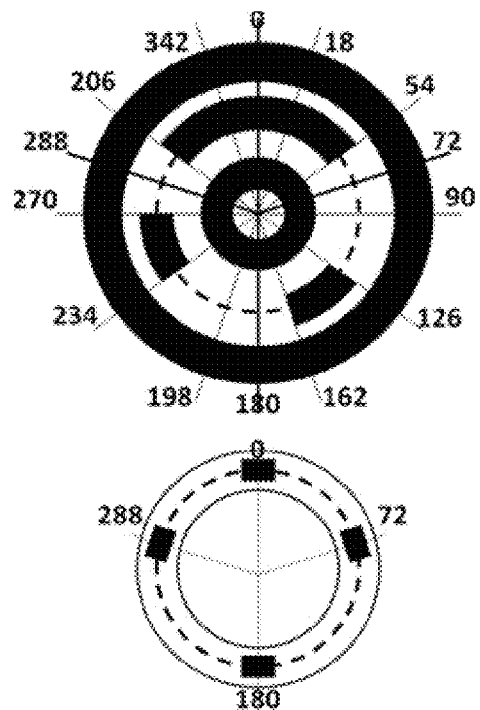

A summary diagram of such an encoding scheme is shown in FIG. 10. The upper half of FIG. 10 shows 10 different angular positions of disk 110' with respect to fixed sensors 116.6-116.9. The table in the lower left has a column for "Digit" which corresponds to the number showing on the wheel for each of these 10 positions. The "Degrees" column is the amount of rotation $\theta$ that has occurred from the $\theta=0°$ position. The "sensor number" column shows the number of sensors is on the fixed circuit board for a given angular location. The sensor output value columns show what signal is output from each of the 4 sensors. These 4 values together make a "code" of "1's and "0"s at each Degree. These four-digit codes are placed in the labels above each of the circles in the upper half of FIG. 10. For example for digit 4 (upper row, far right) starting at θ=0° and going clockwise: sensors 116.6 and 116.7 are in a regions with no variation, whereas sensors 116.8 and 116.9 are in a regions with variation. This occurs at angular rotation value θ=144° and results in an output code of 0011.

Figure 11A:
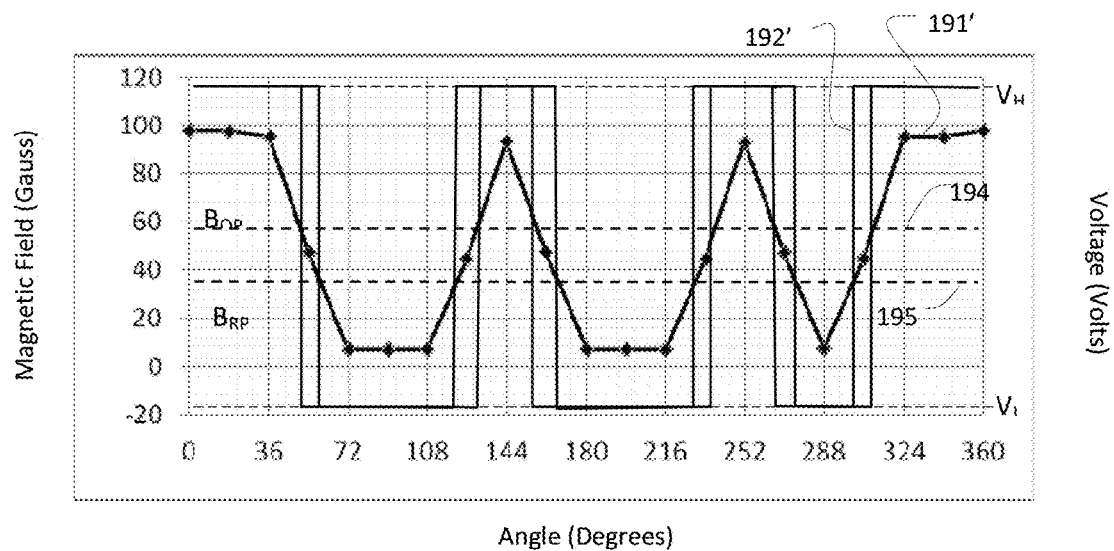
FIGS. 11A-11B show the response curve of the eighth implementation of a magnetic rotary encoder assembly.

FIG. 11 shows a curve illustrating the relationship between the magnetic field and the output of the 4-sensor sensing units. When the magnetic field expected to be present and detected by sensor 116.6 situated at θ=0° while disk rotates through an entire rotation from θ=0° to θ=360° as shown in FIG. 11A. The rotation angle of disk 110' is on the bottom axis of the plot. On the left axis is the resulting $B_{Radial}$ from a magnetic field model. Magnetic field (Gauss) vs. Angle (Degrees) is plotted in the heavy solid line with diamond data labels, curve 191'. The right axis is the sensor voltage output of a magnetic switch sensor which has been described in the art. Sensor output voltage (volts) vs. Angle (degrees) is plotted as the fine curve 192'.

Figure 11B:
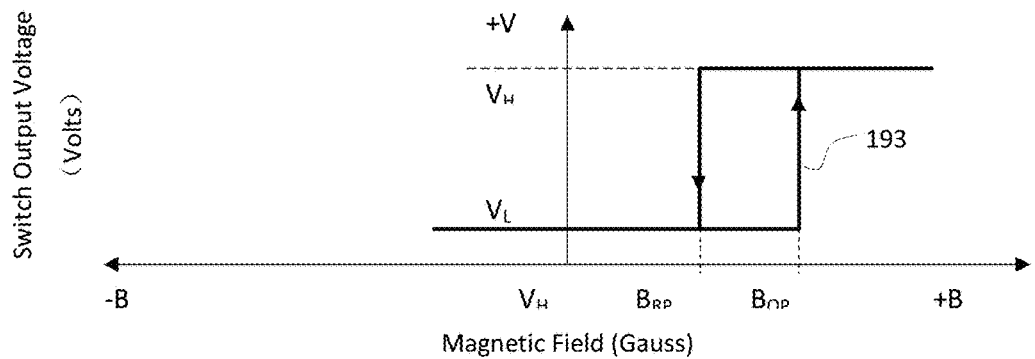

FIG. 11B shows a plot containing representative data from a commercial digital magnetic switch. This switch converts an analog value of magnetic field to a digital (two-state) electronic output. The horizontal axis is magnetic field (gauss), the vertical axis is Switch Sensor Output (Volts). The output voltage of a digital magnet switch vs. applied magnetic field is plotted here as curve 193. Note that there is hysteresis in the curve. When the applied magnetic field is negative, the output is low at value $V_L$. As the field increases, becomes positive, and increases beyond the defined field Operate Point $B_{OP}$, the sensor output switches from low to high, $V_H$. Then, as the magnetic field decreases from a large positive value, the output switches back to $V_L$ at a field value of B Reset Point or $B_{RP}$. The two magnetic field switching threshold values $B_{OP}$ and $B_{RP}$, are plotted as dashed lines 194 and 195 on the upper plot. So, when sensor external field curve 191 crosses the $B_{OP}$ and $B_{RP}$ dashed lines, the sensor output behaves accordingly as shown in curve 193.

Figure 12:
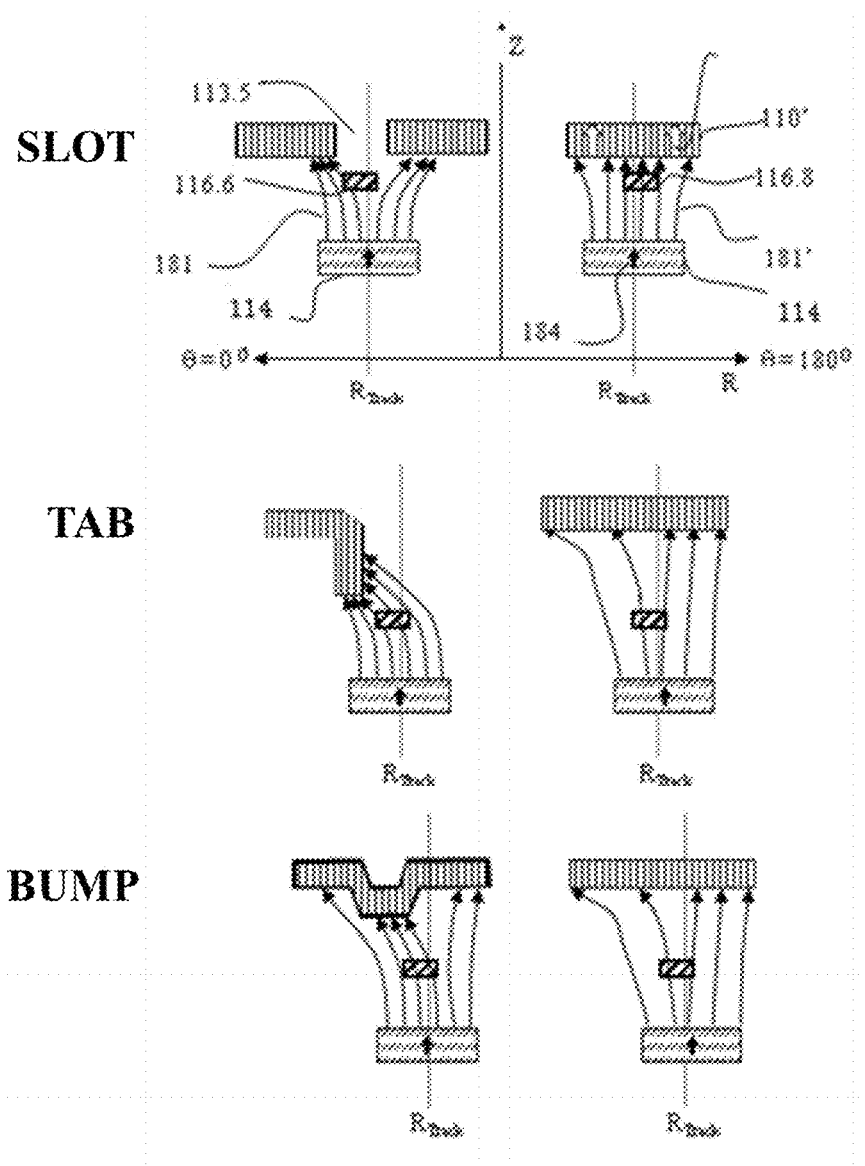
FIG. 12 shows a permeable magnetic disk with holes, tabs, and raised regions.

FIG. 12 shows alternative methods for bending the magnetic flux from the permanent magnet in order to create the signals necessary for the magnetic encoder. The drawing in the top row is the same as the concept shown in FIG. 9, using slotted disks. The drawing in the center row shows another possible modification in which the permeable disk is bent at the outer edge in order to form tabs that distort the magnetic flux in the vicinity of the sensor when the tab passes near the sensor. The drawing in the bottom row shows another possible modification in which the permeable disk is stamped in order to form raised regions that distort the magnetic flux in the vicinity of the sensor when the raised regions pass near the sensor.

There are many ways to use this invention that involve modifications of the underlying concept shown in this example. For example, the number of sensors could be any number, not only 4- and 5-sensor examples shown here. Also, the number and shape of the variations in magnetically permeable disk could be different. All of these kinds of devices, though not explicitly described in detail here, would still be within the spirit and scope of the present invention.

The invention described here has been explained using the simplest coordinate axes and geometrical symmetry possible. This makes the explanation of magnetic field biasing and magnetic sensing easier to understand. However, the degree of symmetry and orthogonality described here should not be taken to limit in any way the scope of the invention. In particular, design elements such as magnetization 182 of disk 110, magnetization 184 of magnet 114, sensing plane 124, encoder disk plane 125, and Gap 126 need not be exactly parallel or perpendicular to their specified geometry. In practical sensing systems, many mechanical and magnetic imperfections are accounted for with calibration routines and software. Generally, then, the description of present invention should be understood to include designs such that items are "substantially parallel" or "substantially perpendicular", where this allows an alignment tolerance of +/−30 degrees. Similarly, the dimension of gap 126 can allow variations up to +/−30% of its specified distance.

The above described preferred embodiments of the present invention do not limit the possible variations of the invention, and those skilled in the art can make various modifications and changes that do not exceed the scope of the invention. Any modification made within the spirit and principle of the present invention by replacement with equivalent or improved features falls within the scope of the present invention.

The invention claimed is:

1. A magnetic absolute rotary encoder, comprising:
   a rotation shaft, the rotation shaft including a plurality of rotating wheels;
   a plurality of encoding units, one encoding unit for each of the rotating wheels; and
   one or more permanent magnet assemblies in each of the plurality of encoding units to provide a magnetic field bias, each of the plurality of encoding units further comprising a permeable magnetic encoder disk, constructed such that a permeability of the permeable magnetic encoder disk uniquely varies with position about the rotation shaft; and a magnetic sensor unit comprising a plurality of magnetic sensors located in a same plane, used for sensing the permeability of the permeable magnetic encoder disk indicative of a position of the permeable magnetic encoder disk, and outputting a signal characterizing the position of the permeable magnetic encoder disk,
   wherein the same plane of the plurality of magnetic sensors is perpendicular to an axis of the rotation shaft,
   wherein the permeable magnetic encoder disk or the magnetic sensor unit rotates along with a corresponding one of the rotating wheels, and the other remains stationary, and
   wherein an output of the magnetic sensing unit characterizes an absolute rotational position of the corresponding one of the rotating wheels.

2. The magnetic absolute rotary encoder of claim 1 wherein the one or more permanent magnet assemblies and the permeable magnetic encoder disk have directions of magnetization aligned parallel to the rotation shaft axis, and a sensing axis of each of the plurality of magnetic sensors is substantially parallel to a direction that is radial to the axis of the rotation shaft.

3. The magnetic absolute magnetic rotary encoder of claim 1 wherein the magnetic sensor unit comprises four or five magnetoresistive sensors, and ten rotational positions are designated for each wheel.

4. The magnetic absolute magnetic rotary encoder of claim 1 wherein the rotary encoder includes a permanent magnet for each of the sensor units.

5. The magnetic absolute magnetic rotary encoder of claim 1 wherein each of the permanent magnet assemblies provides bias for each of the plurality of encoding units.

6. The magnetic absolute magnetic rotary encoder of claim 1 wherein each of the permanent magnet assemblies includes at least one ring-shaped permanent magnet or a plurality of permanent magnets arranged in a circle.

7. The magnetic absolute magnetic rotary encoder of claim 1 wherein each coding unit further comprises a magnetic flux closure device that consists of a soft ferromagnetic material.

8. The magnetic absolute magnetic rotary encoder of claim 1 wherein the permeable magnetic encoder disk includes at least one slot cut into the permeable magnetic encoder disk.

9. The magnetic absolute magnetic rotary encoder of claim 1, wherein the permeable magnetic encoder disk includes at least one bump and/or tab formed in the permeable magnetic encoder disk.

10. The magnetic absolute magnetic rotary encoder of claim 1, wherein the permanent magnet is composed of barium ferrite, cobalt ferrite, neodymium iron boron, or a ferrite.

11. The magnetic absolute magnetic rotary encoder of claim 1, wherein the permeable magnetic encoder disk includes nickel-iron, soft iron, a high permeability magnetic alloy, soft steel, or a soft ferrite.

12. The magnetic absolute magnetic rotary encoder of claim 1, wherein for each of the plurality of encoding units, the permeable magnetic encoder disk and the magnetic sensor unit are separated by a gap with a minimum gap size of 0.1-4 mm.

13. A magnetic absolute rotary encoder, comprising:
a rotation shaft having an axis of rotation, a plurality of rotating assemblies configured to rotate about the axis of rotation, each of the plurality rotating assemblies including a wheel and a permeable magnetic encoder disk connected to the wheel, wherein the permeable magnetic encoder disk is configured to have a permeability that uniquely varies with position about the rotation shaft, the plurality of rotating assemblies being operationally positioned proximate to a respective plurality of fixed assemblies, each fixed assembly including a sensor unit and a fixed magnet to provide a magnetic field bias, wherein the sensor unit includes a plurality of magnetic sensors configured to sense the permeability of the permeable magnetic encoder disk indicative of a position of the permeable magnetic encoder disk and output a signal indicative of an absolute position of the permeable magnetic encoder disk.

14. The magnetic absolute magnetic rotary encoder of claim 13, wherein the permeable magnetic encoder disk includes at least one slot cut into the permeable magnetic encoder disk.

15. The magnetic absolute magnetic rotary encoder of claim 13, wherein in the permeable magnetic encoder disk includes at least one bump, at least one tab, or at least one bump and at least one tab formed in the permeable magnetic encoder disk.

16. The magnetic absolute magnetic rotary encoder of claim 13, wherein the permanent magnet includes barium ferrite, cobalt ferrite, neodymium iron boron, or a ferrite.

17. The magnetic absolute magnetic rotary encoder of claim 13, wherein the permeable magnetic encoder disk includes nickel-iron, soft iron, a high permeability magnetic alloy, soft steel, or a soft ferrite.

18. A magnetic absolute rotary encoder, comprising:
a rotation shaft having an axis of rotation, a plurality of rotating assemblies configured to rotate about the axis of rotation, each of the plurality rotating assemblies including a wheel and a sensor unit connected to the wheel, the plurality of rotating assemblies being operationally positioned proximate to a respective plurality of fixed assemblies, each fixed assembly including a magnetically-permeable disk and a fixed magnet, wherein the fixed magnet is configured to provide a magnetic field bias, and the permeable magnetic encoder disk is configured to have a permeability that uniquely varies with position about the rotation shaft, wherein each of the sensor units includes a plurality of magnetic sensors configured to sense the magnetic permeability of the permeable magnetic encoder disk indicative of a position of the permeable magnetic encoder disk and output a signal indicative the absolute position of the permeable magnetic encoder disk.

19. The magnetic absolute magnetic rotary encoder of claim 18, wherein the permeable magnetic encoder disk includes at least one slot cut into the permeable magnetic encoder disk.

20. The magnetic absolute magnetic rotary encoder of claim 18, wherein in the permeable magnetic encoder disk includes at least one bump, at least one tab, or at least one bump and at least one tab formed in the permeable magnetic encoder disk.

* * * * *

UNITED STATES PATENT AND TRADEMARK OFFICE
CERTIFICATE OF CORRECTION

PATENT NO. : 10,197,419 B2  
APPLICATION NO. : 14/765250  
DATED : February 5, 2019  
INVENTOR(S) : Deak et al.

Page 1 of 1

It is certified that error appears in the above-identified patent and that said Letters Patent is hereby corrected as shown below:

On the Title Page

In item (71), in "Applicant", in Column 1, Line 2, after "Zhangjiagang", insert --, Jiangsu--

In item (72), in "Inventors", in Column 1, Line 1, after "Zhangjiagang", insert --, Jiangsu--

In item (72), in "Inventors", in Column 1, Line 2, after "Zhangjiagang", insert --, Jiangsu--

In item (72), in "Inventors", in Column 1, Line 3, after "Zhangjiagang", insert --, Jiangsu--

In the Claims

In Column 14, Line 35, in Claim 1, after "and", insert --¶--

In Column 16, Line 27, in Claim 18, delete "magnetically-permeable disk" and insert --permeable magnetic encoder disk-- therefor Signed and Sealed this  
Eighth Day of December, 2020

Andrei Iancu  
*Director of the United States Patent and Trademark Office*